United States Patent
Hancock

(10) Patent No.: US 8,928,379 B2
(45) Date of Patent: Jan. 6, 2015

(54) MINIMAL POWER LATCH FOR SINGLE-SLOPE ADCS

(71) Applicant: Bruce R. Hancock, Altadena, CA (US)

(72) Inventor: Bruce R. Hancock, Altadena, CA (US)

(73) Assignee: California Institute of Technology, Pasadena, CA (US)

( * ) Notice: Subject to any disclaimer, the term of this patent is extended or adjusted under 35 U.S.C. 154(b) by 140 days.

(21) Appl. No.: 13/768,027

(22) Filed: Feb. 15, 2013

(65) Prior Publication Data

US 2013/0214760 A1  Aug. 22, 2013

Related U.S. Application Data

(60) Provisional application No. 61/600,410, filed on Feb. 17, 2012.

(51) Int. Cl.
| | |
|---|---|
| *H03K 3/356* | (2006.01) |
| *H03K 3/037* | (2006.01) |
| *G01R 29/00* | (2006.01) |
| *H03K 3/012* | (2006.01) |
| *H03M 1/00* | (2006.01) |
| *H03M 1/12* | (2006.01) |
| *H03M 1/56* | (2006.01) |

(52) U.S. Cl.
CPC .............. *H03K 3/0375* (2013.01); *G01R 29/00* (2013.01); *H03K 3/012* (2013.01); *H03K 3/356104* (2013.01); *H03M 1/002* (2013.01); *H03M 1/123* (2013.01); *H03M 1/56* (2013.01)
USPC ........... 327/208; 327/200; 327/201; 327/206; 327/161

(58) Field of Classification Search
USPC ................. 327/115–118, 161, 185, 355–360, 327/199–203, 208–218; 377/47, 48
See application file for complete search history.

(56) References Cited

U.S. PATENT DOCUMENTS

| | | | |
|---|---|---|---|
| 6,028,816 A * | 2/2000 | Takemae et al. ........... | 365/233.1 |
| 8,462,560 B2 * | 6/2013 | Furutani et al. .......... | 365/189.05 |
| 2007/0115733 A1 * | 5/2007 | Jang et al. ................. | 365/189.07 |
| 2010/0195412 A1 * | 8/2010 | Furutani et al. .......... | 365/189.05 |

\* cited by examiner

*Primary Examiner* — Brandon S Cole
(74) *Attorney, Agent, or Firm* — Milstein Zhang & Wu LLC; Joseph B. Milstein

(57) ABSTRACT

A latch circuit that uses two interoperating latches. The latch circuit has the beneficial feature that it switches only a single time during a measurement that uses a stair step or ramp function as an input signal in an analog to digital converter. This feature minimizes the amount of power that is consumed in the latch and also minimizes the amount of high frequency noise that is generated by the latch. An application using a plurality of such latch circuits in a parallel decoding ADC for use in an image sensor is given as an example.

15 Claims, 4 Drawing Sheets

MINIMAL POWER LATCH FOR SINGLE-SLOPE ADCS

CROSS-REFERENCE TO RELATED APPLICATIONS

This application claims priority to and the benefit of U.S. provisional patent application Ser. No. 61/600,410, filed Feb. 17, 2012, which application is incorporated herein by reference in its entirety.

STATEMENT REGARDING FEDERALLY FUNDED RESEARCH OR DEVELOPMENT

The invention described herein was made in the performance of work under a NASA contract, and is subject to the provisions of Public Law 96-517 (35 USC 202) in which the Contractor has elected to retain title.

THE NAMES OF THE PARTIES TO A JOINT RESEARCH AGREEMENT

NOT APPLICABLE

INCORPORATION-BY-REFERENCE OF MATERIAL SUBMITTED ON A COMPACT DISC

NOT APPLICABLE

FIELD OF THE INVENTION

The invention relates to electronic circuits in general and particularly to a dual R-S latch.

BACKGROUND OF THE INVENTION

Single-slope ADCs are particularly attractive for use in applications such as column-parallel digitization in image sensors because of their relative simplicity and the fact that key pieces of the circuitry can be shared by all the columns. Additionally, they offer excellent Differential Non-Linearity ("DNL") and, with careful design of the ramp generator, which is shared, good Integral Non-Linearity ("INL") as well. Another advantage is that because the ramp is shared, gain matching between the columns is automatic. Their relatively slow speed is mitigated by the large multiplicity of converters.

In many applications, a commonly used circuit comprises a ramp generator and a counter, which generates a code value that tracks the progress of the ramp. Each unit cell contains a comparator and a set of latches that capture the code value at the time the ramp crosses the input voltage, as indicated by the comparator. If continuous-time comparators are used the count must be represented by Gray code to avoid the possibility of error in the capture at code transitions. Gray code is a binary code invented by Frank Gray (see U.S. Pat. No. 2,632,058, issued Mar. 17, 1953) which has the property that only one binary digit ("bit") switches between successive integer values represented by the code, even when Gray code "rolls over" (e.g., reaches the limit of the values representable by the number of bits used, and goes back to zero, represented by bits, all of which are set to zero). These properties are not present in standard binary code.

Because of the large multiplicity of unit cells, it is important to keep their size and power consumption low. The common approach is to use a transparent latch or flip-flop clocked by the comparator output. However, in both these circuits the internal nodes switch every time the code changes until the comparator trips and freezes the value. This switching produces shoot-through and charging currents. A typical latch in a 3.3 V, 0.35 μm process may consume 0.3 pC each time the input changes in the transparent state. For a code rate of ~10 MHz, the resulting average current may be comparable to the comparator current. The instantaneous current, multiplied by the number of columns, can be quite large and it will contain very high frequency components which can create noise. As successive comparators trip, freezing the latches, the total current will decrease. This changing power supply loading may lead to crosstalk or linearity issues.

There is a need for an improved latch that can minimize the power consumption and noise generation of the latch or memory of an ADC.

SUMMARY OF THE INVENTION

According to one aspect, the invention features a minimal power latch circuit. The minimal power latch circuit comprises a first latch and a second latch, the first latch having an input at which to receive a comparator signal C, an input at which to receive a code value signal D, and an input at which to receive a signal Q1 from the second latch, and having an output at which to provide an output signal Q0; and the second latch having an input at which to receive the comparator signal C, an input at which to receive the code value signal D, and an input at which to receive the signal Q0 from the first latch, and having an output at which to provide the output signal Q1; the first latch and the second latch constructed to operate according to a pair of equations in which the first latch equation is given by $\overline{Q0'} = (Q0 \cdot D) + \overline{C} + Q1$ and the second latch equation is given by $Q1' = (Q1 + D) \cdot C \cdot \overline{Q0}$; the comparator signal C representing a comparison as a function of time of a signal to be measured and a monotonically varying reference signal; the code value signal D representing a time increment measured from a start of the monotonically varying reference signal; and a selected one of the signal Q0 and the signal Q1 encoded with information indicative of the code value signal D at a time when no more than one of the first latch and the second latch is set.

In one embodiment, the code value signal D is represented in Gray code.

In another embodiment, the monotonically varying reference signal is a linear signal.

In yet another embodiment, the monotonically varying reference signal is a stair step signal.

In still another embodiment, the comparator is an operational amplifier.

In a further embodiment, a source of the signal to be measured is an element of an M×N array of signal sources, where M and N are integers.

In yet a further embodiment, the monotonically varying reference signal is a signal common to a comparator connected to said minimal power latch circuit and a comparator connected to at least one additional latch circuit.

In an additional embodiment, both the first latch and the second latch are configured to be reset at the beginning of a time interval during which the monotonically varying reference signal is present.

According to another aspect, the invention relates to a method of measuring a signal. The method of measuring a signal comprises the step of providing a minimal power latch circuit. The minimal power latch circuit comprises a first latch and a second latch, the first latch having an input at which to receive a comparator signal C, an input at which to receive a code value signal D, and an input at which to receive a signal Q1 from the second latch, and having an output at which to provide an output signal Q0; and the second latch having an input at which to receive the comparator signal C, an input at which to receive the code value signal D, and an input at which to receive the signal Q0 from the first latch, and having an output at which to provide the output signal Q1; the first latch and the second latch constructed to operate according to a pair of equations in which the first latch equation is given by $\overline{Q0'} = (\overline{Q0} \cdot D) + \overline{C} + Q1$ and the second latch equation is given by $Q1' = (Q1+D) \cdot C \cdot \overline{Q0}$. The method further comprises the steps of resetting each of the first latch and the second latch; providing the signal to be measured; providing the monotonically varying reference signal and the code value signal D representing a time increment measured from a start of the monotonically varying reference signal; comparing the signal to be measured against the monotonically varying reference signal to generate the comparator signal C; encoding a selected one of the signal Q0 and the signal Q1 with information indicative of the code value signal D at a time when no more than one of the first latch and the second latch is set; and reading the selected one of the signal Q0 and the signal Q1 once the monotonically varying reference signal has attained its final value; deducing as a result a value of the signal to be measured from the selected one of the signal Q0 and the signal Q1; and performing at least one of recording the result, transmitting the result to a data handling system, or to displaying the result to a user.

In one embodiment, the monotonically varying reference signal is a linear signal.

In another embodiment, the monotonically varying reference signal is a stair step signal.

In yet another embodiment, the monotonically varying reference signal is commonly applied to a comparator connected to the minimal power latch circuit and a comparator connected to at least one additional latch circuit.

In still another embodiment, only one of the first latch and the second latch is set during the measurement.

In a further embodiment, neither of the first latch and the second latch is set during the measurement.

In yet a further embodiment, the code value signal D is represented in Gray code.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

Figure 1:
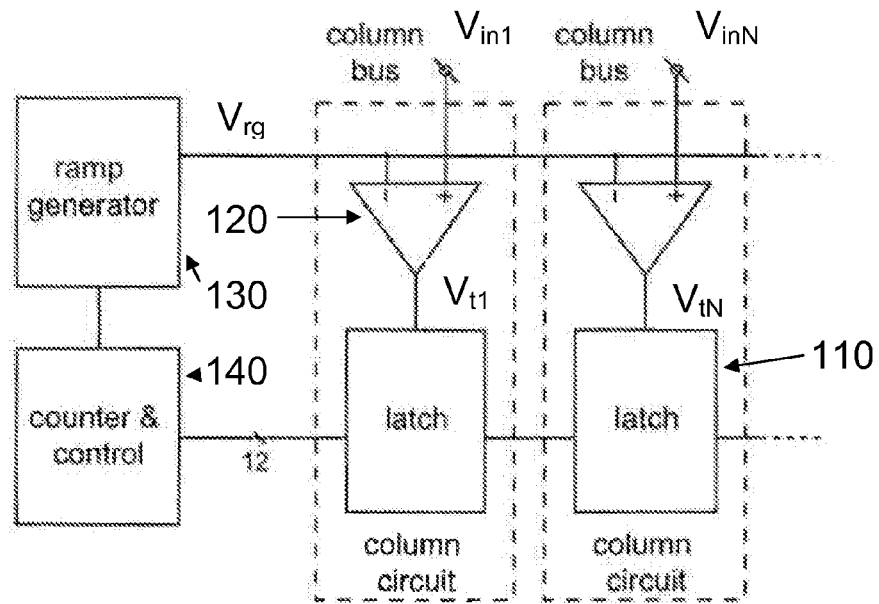
FIG. 1 illustrates a block diagram of a column-parallel single-slope ADC of the prior art.

FIG. 1 is a schematic block diagram of a column-parallel single-slope ADC of the prior art, which has N columns which operate in parallel. In each column there is provided a comparator 120, for example an operational amplifier, which compares an input voltage ($V_{in1}, \ldots, V_{inN}$) for the respective column with a ramp voltage $V_{rg}$ by ramp generator 130 that is commonly applied to each of the ADC circuit for each column. This ramp voltage spans the entire input range of the ADC. In the conventional single-slope ADC, the ramp voltage $V_{rg}$ increases (or decreases) monotonically (which in some cases is a linear change) with time, and can in general be represented by a step function that increases by a predefined increment $\Delta_I$ after each increment of time $\Delta_t$. A common digital counter and control 140 is running synchronously with the ramp voltage generator 130. The comparator reports whether the ramp voltage is greater or less than the signal voltage. The latch is edge-triggered by the transition as the ramp voltage crosses the signal voltage. The comparator will generally have a resolution considerably better than the quantization step. When a column comparator 120 detects that the ramp voltage has crossed its input voltage, it triggers a digital latch 110 or digital memory implemented in each column circuit, and the respective comparator output voltage $V_{t1}, \ldots, V_{tN}$ undergoes a step change. This signals the respective latch 110 or memory to store a value output by the common digital counter and control 140. The value is a value in a unique code sequence whose relation to the ramp voltage is known. Thus, the stored digital word in each respective latch 110 is representative of the input voltage of the corresponding column-parallel ADC at the time that the latch was set. In some embodiments, the system can be calibrated to provide an effective ramp value that corresponds to each unique code value.

A single-slope ADC according to the present invention comprises a ramp generator; a multi-bit counter or code generator; a comparator; and a set of latches for capturing the code value when the comparator changes states (or "trips"). There will be one latch for each bit of the code, and all will be clocked by the same comparator. The description here details the latch for one such bit. A column-parallel single-slope ADC comprises a collection of single-slope ADCs that share a common ramp generator and code generator.

CMOS logic gates consume negligible power in the static state. When their outputs change, they consume power in a short pulse. This invention is particularly relevant to CMOS implementations because of the large contrast between static and switching states, but may also be applicable to other logic technologies.

The latches in single-slope ADCs normally comprise D-latches or flip-flops. Both of these circuits contain internal logic which switches every time the input data changes up until the data is latched, and therefore consumes power even when the result is not yet determined The power consumed may be significant. In addition, the pulsed nature of the power consumption generates high frequency electromagnetic noise. Additionally, in a column-parallel ADC the power varies with time as successive columns latch their data, leading to possible crosstalk.

The invention described here is a latch that consumes power only at the moment of latching the data. It comprises a pair of set-reset (S-R) latches configured so that the first will set when the comparator output is high and the data is low, but only if the second latch is not already set; and a second latch that sets when the comparator output is high and the data is high, but only if the first latch is not already set. An S-R latch is any circuit which implements one of the equations $$Q'=(Q+S)\cdot\overline{R} \quad (1a)$$

or $$Q'=Q\cdot\overline{R}+S \quad (1b)$$

where Q is the present state, Q' is the next state, S is the set signal, and R is the reset signal, and the operator + represents logical OR, the operator · represents logical AND and the bar operator $(\overline{X})$ represents logical negation (i.e., NOT X). The two forms differ when S and R are asserted simultaneously, and either can be applied. It will be recognized that equivalent latch circuits can be built where one or more of the signals is complementary, or negative-true. These latches may be static or dynamic.

The essential form of the minimal power latch is described by the equations $$S0=C\cdot\overline{D}\cdot\overline{Q1},\ S1=C\cdot D\cdot\overline{Q0} \quad (2a)$$

where C is the comparator output and D is the data bit. The reset signals can be implemented in various ways, and will be addressed shortly.

Initially, both latches are reset, and at the start of the ramp C is low. Both latch outputs will remain low. When the comparator output transitions from low to high, there are two possible cases. If D is low, Q0 will be set and a short pulse of power will be consumed. If D later becomes high, Q0 will remain high but Q1 will not set, being inhibited by $\overline{Q0}$. No further power will be consumed. Likewise, if D is high when C transitions from low to high Q1 will be set, with a short pulse of power consumption, but Q0 will thereafter be inhibited. At the end of the ramp, if the comparator has been tripped, exactly one of the latches will be set. If neither latch is set, this may be interpreted as an over-range signal.

This achieves the goal that power be consumed in the latches only at the moment of capturing the data. However, in (2a) complementary forms of D are required. D changes rapidly, and the generation of $\overline{D}$ will entail the consumption of power. In a column-parallel ADC, this generation may be shared, mitigating the power consumption, but additional layout area will be needed to distribute the signal.

This shortcoming of (2a) can be overcome by applying De Morgan's rule to the equation for S0, generating the logically equivalent equations $$\overline{S0}=\overline{C}+D+Q1,\ S1=C\cdot D\cdot\overline{Q0} \quad (2b)$$

Now only a single polarity of D is required, but complementary values of C are needed. However, comparators commonly provide complementary outputs, and in any case the comparator trips only once per ramp, so the power consumption is minimal. Of course, De Morgan's rule might equally well have been applied to the equation for S1 instead, then requiring only the single polarity $\overline{D}$.

We now address the reset signals, R0 and R1. These can, of course be externally driven logic signals, whether common or individual, used to reset the latches at the beginning of the ramp. However, we may take advantage of the fact that the comparator output, C, will also be reset at the beginning of the ramp and use it to clear the latches. There is also benefit, although it is not necessary, in using the inhibit signals to actively clear the latches. This is useful when the rising transition of C occurs simultaneously with a transition of D, which might in practice produce an ambiguous situation where both latches are set. Using the inhibit signal as a reset guarantees that one of the two latches wins out and the other is reset.

The reset signals can then be generally written $$R0=R+\overline{C}+Q1,\ R1=R+\overline{C}+Q0 \quad (3a)$$

where a common reset signal, R, is assumed. Only one of R and $\overline{C}$ is necessary, although both can be provided, while the Q0 and Q1 terms are optional.

In the case where De Morgan's rule has been applied to the first latch, as in (2a) we may again generate the logically equivalent $$\overline{R0}=\overline{R}\cdot C\cdot\overline{Q1},\ R1=R+\overline{C}+Q0 \quad (3b)$$

Any combination of (1a) or (1b) with (2a) or (2b) and (3a) or (3b), or their logical equivalents, constitutes the minimal power latch.

For practical application, the combination of (1a), (2b) and (3b) without the R term is most useful. Although these equations may be implemented in any manner, including traditional NAND and NOR logic, the use of complex logic gates is particularly beneficial. This may be seen, after a little manipulation, by writing the combination as $$\overline{Q0}'=\overline{Q0}\cdot D+Q1+\overline{C},\ Q1'=(Q1+D)\cdot\overline{Q0}\cdot C \quad (4)$$

In some embodiments, C and Q0 will be negative-true.

Figure 2B:
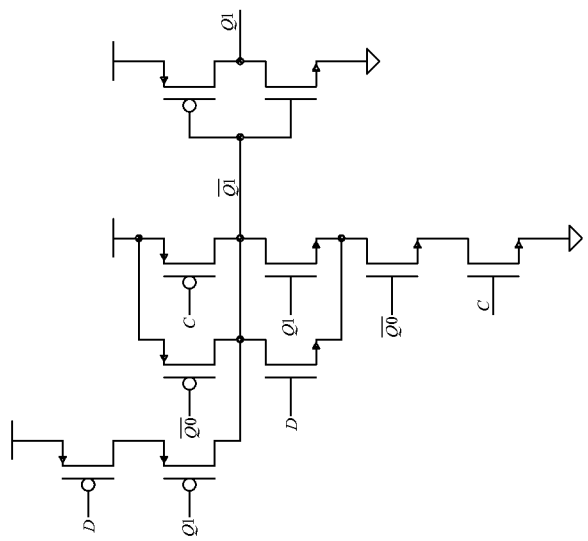
FIG. 2A and FIG. 2B illustrate an implementation of a minimal power latch circuit according to principles of the invention using complex logic gates.
Figure 2A:
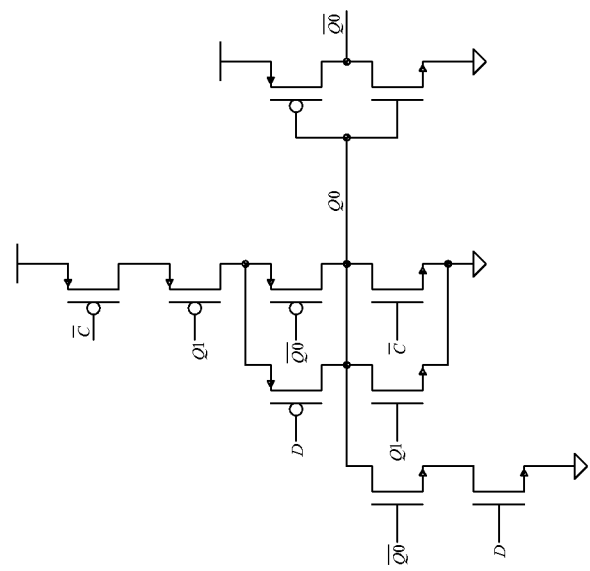

A CMOS circuit implementation of this is shown in FIG. 2A and FIG. 2B, where it should be pointed out that all permutations of the series elements are logically equivalent.

Figure 3B:
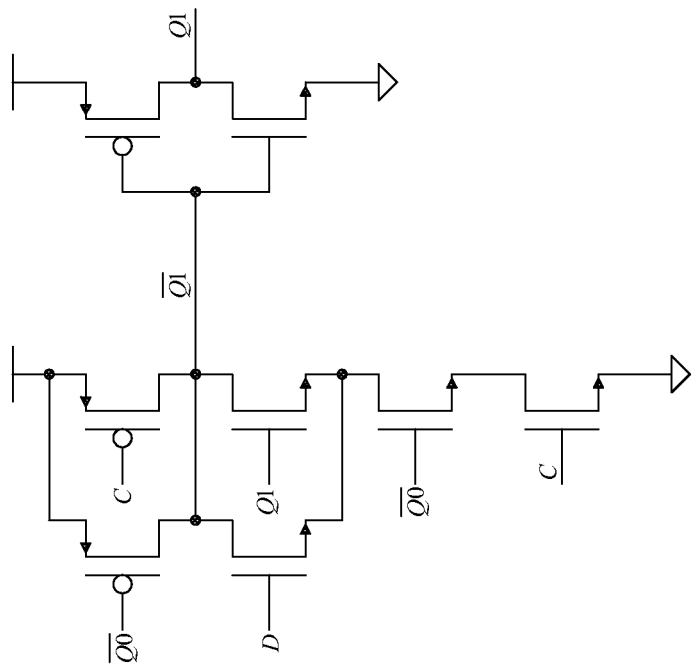
FIG. 3A and FIG. 3B illustrate another implementation of a minimal power latch circuit according to principles of the invention using complex logic gates, in which redundant transistors have been removed.
Figure 3A:
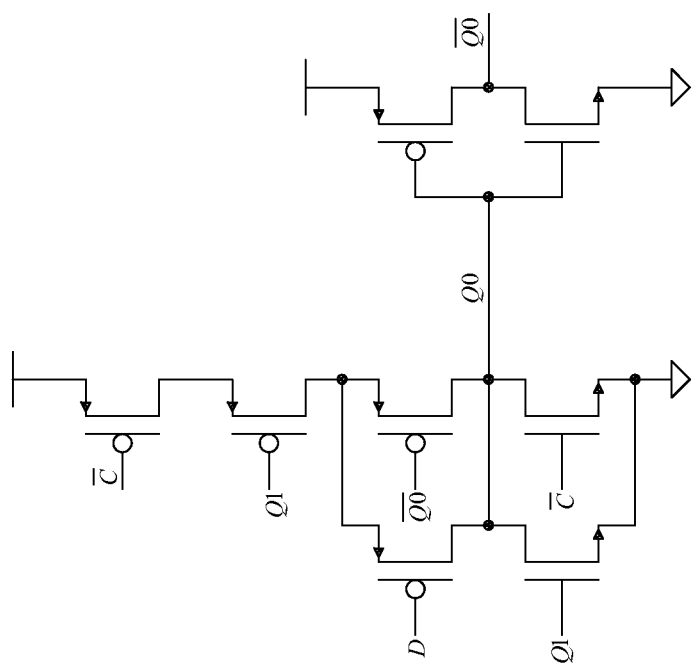

The design can be further refined, as shown in FIG. 3A and FIG. 3B, by removing certain redundant transistors: the series NMOS transistors representing $\overline{Q0}\cdot D$ in the first latch, and the series PMOS transistors representing Q1+D in the second latch. These would normally hold the static latches in reset when they are not supposed to be set. However, before the comparator is tripped the $\overline{C}$ and C transistors perform this function. After the comparator is tripped, one of the latches will be set and the Q1 or $\overline{Q0}$ transistor will perform this function. Thus, the series pairs are not needed.

Figure 4:
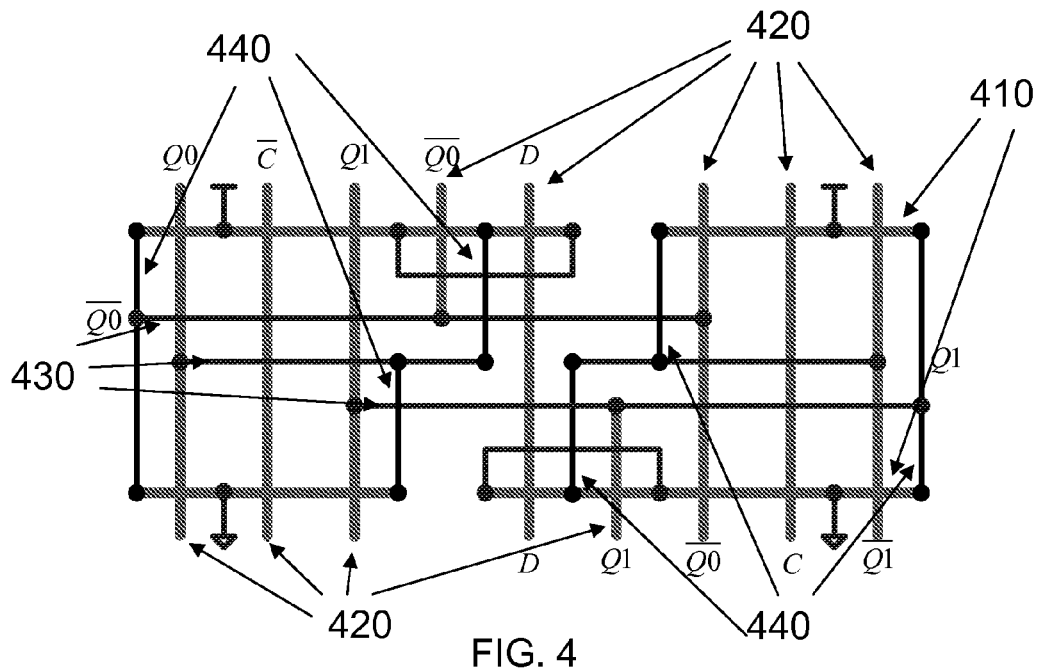
FIG. 4 is a schematic showing an efficient CMOS layout for a minimal power latch circuit, in which thicker horizontal lines 410, thicker vertical lines 420, thinner horizontal lines 430 and thinner vertical lines 340 represent active, gate, metal1 and metal2, respectively.

The fact that the first latch contains two NMOS transistors and four PMOS transistors, while the second latch contains four NMOS transistors and two PMOS transistors, make possible an efficient, overlapping layout, shown in FIG. 4.

In electrical engineering, one can build equivalent circuits by providing a dual circuit (in which each parameter is replaced by its dual, that is voltage and current are duals, resistance and conductance are duals, and impedance and capacitance are duals), or by providing a circuit using inverted polarities and inverted logic (e.g., positive and negative signal amplitudes are interchanged, and the meaning of "on" and "off" or "0" and "1" are interchanged, thereby exchanging positive logic and negative logic).

A particularly efficient CMOS layout of this circuit, shown schematically in FIG. 4, takes advantage of the unequal numbers of NMOS and PMOS transistors in each of the two latches. The two complementary latches are overlapped, and the common signal, D, is shared. This layout takes only nine gate pitches.

Because these converters are likely to be run fast and continuously, it is tempting to implement the circuit using dynamic latches. However, simulation shows that if the edge rate of D is slow, which is likely when driving a large number of columns, the latches may partially set. Without the positive feedback to force them into stable states, nodes Q0 and $\overline{Q1}$ may remain at mid-supply voltages, causing large currents to flow through the inverters. This is counter to our purpose. Therefore, a dynamic latch implementation is not a practical choice.

In summary, we have described a latch circuit, useful for single slope ADCs, which consumes no power except at the moment that it actually captures data. The latch circuit is useful to minimize the power needed to run it. In addition, because the latch circuit only switches once (if at all), the noise generated by switch is minimized as well. Furthermore, its implementation is compact and efficient.

Figure 5:
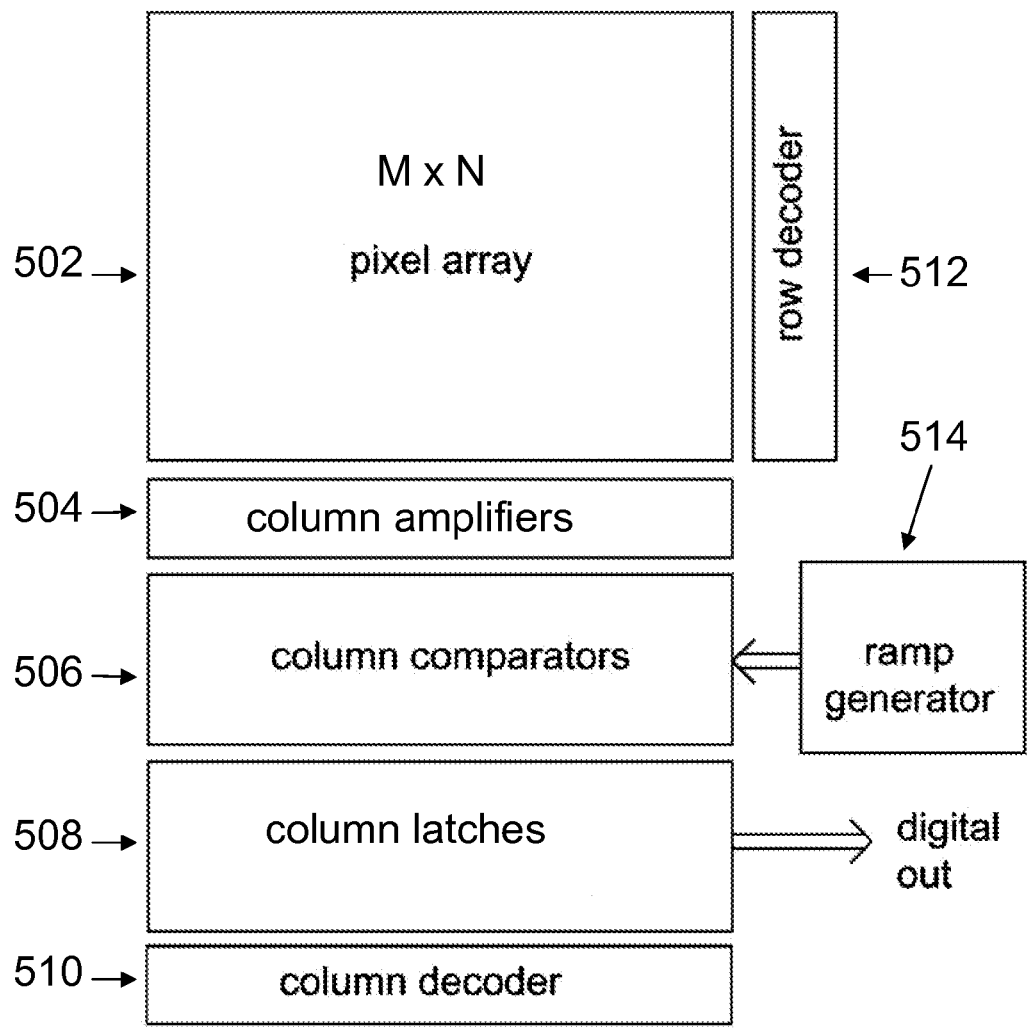
FIG. 5 is a schematic diagram of an implementation of an imager that uses a column level single slope ADC with a minimal power latch circuit according to principles of the invention.

FIG. 5 is a schematic diagram of an embodiment of an imager that uses a column level single slope ADC having minimal power latch circuits as described herein.

Pixel array 502 is an array that has M rows and N columns, thereby providing an image having M×N pixels, where M and N are integers. In general, at least one of M and N is greater than one. In some embodiments, at least one of M and N is a power of 2. In some embodiments, a ratio of M and N is in a selected ratio such as 4:3 or 9:16. The pixel array 502 can be fabricated using any convenient technology. In one embodiment, the pixel array 502 is a CMOS array. While this embodiment that is being used to explain the utility and method of use of the minimal power latch circuit uses signals from a particular type of imager array, it should be understood that the minimal power latch circuit (in one unit or a in plurality of units used in parallel) can be used with any signal source that one wishes to measure by digitizing or quantizing. The operation of the array can be single shot (as in taking a still picture), or can be iterative (as in recording a sequence of images).

The pixel array 502 is configured to be sampled using a column by column embodiment, in which each row of N pixels is sampled simultaneously. The row decoder 512 determines which of the M rows will be decoded at any specific cycle, by enabling one of the M rows and disabling all of the other M−1 rows during a specific interrogation cycle. Commonly, the rows are sampled in sequence from one side of the array to the other. However, sampling the rows in any order is in principle possible.

In some embodiments, N column amplifiers 504 are provided to amplify each of the column signals. In some embodiments, the N column amplifiers 504 are optionally omitted.

There are provided N column comparators 506 that receive a common ramp signal, such as a ramp voltage generated by ramp generator 514. In one embodiment, the ramp voltage signal cycles periodically from a minimum voltage to a maximum voltage. In other embodiments, the ramp voltage signal cycles from a maximum voltage to a minimum voltage, and the comparator output is inverted relative to a rising ramp signal. In some embodiments, or if viewed at low resolution, the ramp voltage can resemble a sawtooth function. In some embodiments, or if viewed at high enough resolution, the ramp signal is a stair step function having discrete amplitude for a specific time interval. In either case, the ramp signal can be represented as a monotonic function over a time interval, so that if one knows or can measure an elapsed time interval from the start of the ramp function, one can compute or deduce the magnitude of the ramp function signal at that time. In the circumstance where the ramp function rise time is measured by a digital clock, the number of elapsed clock intervals is in general a measure of the magnitude of the ramp function signal at that time. In a typical embodiment, the clock frequency is tens of MHz or higher. In a typical embodiment, the digital resolution of the steps is measured using 8, 10, or 12 bits. The conversion time may become prohibitively long for devices using more than 12 bits, although for slowly varying signals that are sensed on a sufficiently long time scale, ADCs that provide 20 or more bits of precision can be used.

As has been explained, when the voltage provided by the ramp generator 514 and the signal from a pixel in an active row in the column being measured by the comparator 506 for that row are equal, e.g., when the ramp signal increases (or decreases) to match the signal from an active pixel, the output signal of the comparator 506 undergoes a step change. The step change occurs at most once per cycle of the ramp signal, when the column signal falls somewhere between the minimum amplitude of the ramp signal and the maximum amplitude of the ramp signal. If the ramp signal is always greater than the column signal, one can deduce that the column signal must be below the lowest level of the ramp, or "out of range" on the low side of the ramp. If the ramp signal is always smaller than the column signal, one can deduce that the column signal is "out of range" on the high side of the ramp or is excessively large.

The column latches 508 receive the output signal of the respective column comparators 506. Therefore, each column latch 508 can provide the following three possible outputs. If the respective column signal fall in the range where the output of the respective comparator 506 undergoes a step change, the latch 508 records a time value that is indicative of the amplitude of the column signal. If the output signal of the comparator 506 is always in one state, that state defines whether the column signal is zero (e.g., the ramp voltage is always the "high" signal) or is over range (e.g., the ramp voltage is always the "low" signal).

The column decoder 510 can control a sequence in which each of the column latches will provide a digital output signal (denoted by the arrow labeled "digital out") which output can be interpreted as described hereinabove. The row decoder 512 controls which row of pixels is to be sampled at any particular time.

In some embodiments, the column decoder 510 and/or the row decoder 512 are implemented using a microprocessor operating under the control of one or more instructions recorded on a machine readable medium. In some embodiments, the column decoder 510 and/or the row decoder 512 are controlled by an off-chip source, such as a microprocessor, an FPGA, or custom circuitry. In other embodiments, a microprocessor operating under the control of one or more instructions recorded on a machine readable medium is provided to control one or more of the pixel array 502, the column amplifiers 504, the column comparators 506, the column latches 508, the column decoder 510, the row decoder 512 and the ramp generator 514.

The process of enabling a row to be sampled, doing the sampling process and providing digital output, and resetting the column latches after the data they contain has been output can be iterated as many times as necessary to sample as many of the M rows as may be required.

Definitions

Recording the results from an operation or data acquisition, such as for example, recording results at a particular frequency or wavelength, is understood to mean and is defined herein as writing output data in a non-transitory manner to a storage element, to a machine-readable storage medium, or to a storage device. Non-transitory machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/ SD adapter) that accommodate and read from and/or write to the storage media. Unless otherwise explicitly recited, any reference herein to "record" or "recording" is understood to refer to a non-transitory record or a non-transitory recording.

As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes. Recording image data for later use (e.g., writing an image to memory or to digital memory) can be performed to enable the use of the recorded information as output, as data for display to a user, or as data to be made available for later use. Such digital memory elements or chips can be standalone memory devices, or can be incorporated within a device of interest. "Writing output data" or "writing an image to memory" is defined herein as including writing transformed data to registers within a microcomputer.

"Microcomputer" is defined herein as synonymous with microprocessor, microcontroller, and digital signal processor ("DSP"). It is understood that memory used by the microcomputer, including for example instructions for data processing coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microcomputer functions, either in hardware logic, software emulation of a microcomputer, or by a combination of the two. Apparatus having any of the inventive features described herein can operate entirely on one microcomputer or can include more than one microcomputer.

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use, so that the result can be displayed, recorded to a non-volatile memory, or used in further data processing or analysis.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein, so long as at least some of the implementation is performed in hardware.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A minimal power latch circuit, comprising:
   a first latch and a second latch, said first latch having an input at which to receive a comparator signal C, an input at which to receive a code value signal D, and an input at which to receive a signal Q1 from said second latch, and having an output at which to provide an output signal Q0; and
   said second latch having an input at which to receive said comparator signal C, an input at which to receive said code value signal D, and an input at which to receive said signal Q0 from said first latch, and having an output at which to provide said output signal Q1;

said first latch and said second latch constructed to operate according to a pair of equations in which a first latch equation is given by $\overline{Q0'}=(\overline{Q0}\cdot D)+\overline{C}+Q1$ and a second latch equation is given by $Q1'=(Q1+D)\cdot C\cdot \overline{Q0}$;

said comparator signal C representing a comparison as a function of time of a signal to be measured and a monotonically varying reference signal;

said code value signal D representing a time increment measured from a start of said monotonically varying reference signal; and a selected one of said signal Q0 and said signal Q1 encoded with information indicative of said code value signal D at a time when no more than one of said first latch and said second latch is set.

2. The minimal power latch circuit of claim 1, wherein said code value signal D is represented in Gray code.

3. The minimal power latch circuit of claim 1, wherein said monotonically varying reference signal is a linear signal.

4. The minimal power latch circuit of claim 1, wherein said monotonically varying reference signal is a stair step signal.

5. The minimal power latch circuit of claim 1, wherein said comparator is an operational amplifier.

6. The minimal power latch circuit of claim 1, wherein a source of said signal to be measured is an element of an M×N array of signal sources, where M and N are integers.

7. The minimal power latch circuit of claim 1, wherein said monotonically varying reference signal is a signal common to a comparator connected to said minimal power latch circuit and a comparator connected to at least one additional latch circuit.

8. The minimal power latch circuit of claim 1, wherein both said first latch and said second latch are configured to be reset at the beginning of a time interval during which said monotonically varying reference signal is present.

9. A method of measuring a signal, comprising the steps of:
providing a minimal power latch circuit, comprising:
a first latch and a second latch, said first latch having an input at which to receive a comparator signal C, an input at which to receive a code value signal D, and an input at which to receive a signal Q1 from said second latch, and having an output at which to provide an output signal Q0; and said second latch having an input at which to receive said comparator signal C, an input at which to receive said code value signal D, and an input at which to receive said signal Q0 from said first latch, and having an output at which to provide said output signal Q1;

said first latch and said second latch constructed to operate according to a pair of equations in which said first latch equation is given by $\overline{Q0'}=(\overline{Q0}\cdot D)+\overline{C}+Q1$ and said second latch equation is given by $Q1'=(Q1+D)\cdot C\cdot\overline{Q0}$;

resetting each of said first latch and said second latch;

providing said signal to be measured;

providing said monotonically varying reference signal and said code value signal D representing a time increment measured from a start of said monotonically varying reference signal;

comparing said signal to be measured against said monotonically varying reference signal to generate said comparator signal C;

encoding a selected one of said signal Q0 and said signal Q1 with information indicative of said code value signal D at a time when no more than one of said first latch and said second latch is set; and reading said selected one of said signal Q0 and said signal Q1 once said monotonically varying reference signal has attained its final value;

deducing as a result a value of said signal to be measured from said selected one of said signal Q0 and said signal Q1; and performing at least one of recording said result, transmitting said result to a data handling system, or to displaying said result to a user.

10. The method of measuring a signal of claim 9, wherein said monotonically varying reference signal is a linear signal.

11. The method of measuring a signal of claim 9, wherein said monotonically varying reference signal is a stair step signal.

12. The method of measuring a signal of claim 9, wherein said monotonically varying reference signal is commonly applied to a comparator connected to said minimal power latch circuit and a comparator connected to at least one additional latch circuit.

13. The method of measuring a signal of claim 9, wherein only one of said first latch and said second latch is set during said measurement.

14. The method of measuring a signal of claim 9, wherein neither of said first latch and said second latch is set during said measurement.

15. The method of measuring a signal of claim 9, wherein said code value signal D is represented in Gray code.

* * * * *